(12) United States Patent
Shin et al.

(10) Patent No.: US 7,187,700 B2
(45) Date of Patent: Mar. 6, 2007

(54) METHOD FOR MAINTAINING WAVELENGTH-LOCKING OF FABRY-PEROT LASER REGARDLESS OF CHANGE OF EXTERNAL TEMPERATURE AND WDM LIGHT SOURCE USING THE METHOD

(75) Inventors: Dong-Jae Shin, Suwon-shi (KR); Dae-Kwang Jung, Suwon-shi (KR); Jea-Hyuck Lee, Anyang-shi (KR); Jung-Kee Lee, Suwon-shi (KR); Seong-Taek Hwang, Pyongtaek-shi (KR); Yun-Je Oh, Yongin-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 182 days.

(21) Appl. No.: 10/730,568

(22) Filed: Dec. 8, 2003

(65) Prior Publication Data

US 2004/0208208 A1 Oct. 21, 2004

(30) Foreign Application Priority Data

Apr. 21, 2003 (KR) ...................... 10-2003-0025147

(51) Int. Cl.
*H01S 3/13* (2006.01)
(52) U.S. Cl. ................. 372/32; 372/38.07; 372/29.015; 372/29.02
(58) Field of Classification Search ............. 372/38.07, 372/32, 29.015, 29.02
See application file for complete search history.

(56) References Cited

U.S. PATENT DOCUMENTS 4,796,996 A * 1/1989 Burns .......................... 356/256

(Continued)

FOREIGN PATENT DOCUMENTS

JP 2002-525879 8/2002

(Continued)

OTHER PUBLICATIONS

Kim, Hyun Deok et al.; A Low-Cost WDM Source with an ASE Injected Fabry-Perot Semiconductor Laser, IEEE Photonics Technology Letters, vol. 12, No. 8 (2000) 4 pgs.

*Primary Examiner*—Minsun Oh Harvey
*Assistant Examiner*—Delma R. Flores Ruiz
(74) *Attorney, Agent, or Firm*—Cha & Reiter, L.L.C.

(57) ABSTRACT

Disclosed is a method for maintaining wavelength-locking of a Fabry-Perot laser regardless of a change of external temperature even though a temperature controller is not used, and a wavelength division multiplexing (WDM) light source using the method, as an economical light source used in a WDM optical communication field. The WDM light source comprises a Fabry-Perot laser for injecting spectrum-spliced incoherent light to amplify and output only an oscillation mode matching with a wavelength of the injected light, and a bias controlling unit for adjusting a bias current supplied to the Fabry-Perot laser to a value adjacent to a threshold current of the Fabry-Perot laser, whose threshold current is changed according to a temperature and a relationship between the injected light changed depending to a temperature and a wavelength of the oscillation mode. Therefore, the bias current having a value adjacent to the threshold current of the Fabry-Perot laser is supplied to the Fabry-Perot laser, so that the Fabry-Perot laser can maintain an excellent transmission characteristic regardless of a change of temperature even though a temperature controller is not used.

11 Claims, 7 Drawing Sheets

U.S. PATENT DOCUMENTS

| | | | |
|---|---|---|---|
| 5,398,008 A * | 3/1995 | Nissler et al. | 332/178 |
| 5,398,256 A * | 3/1995 | Hohimer et al. | 372/94 |
| 5,651,016 A * | 7/1997 | Yu et al. | 372/34 |
| 5,812,572 A * | 9/1998 | King et al. | 372/38.04 |
| 6,018,540 A * | 1/2000 | Kinoshita | 372/46.01 |
| 6,055,252 A * | 4/2000 | Zhang | 372/34 |
| 6,324,197 B1 * | 11/2001 | Suda | 372/38.01 |
| 6,771,909 B2 * | 8/2004 | Farhan et al. | 398/72 |
| 6,859,477 B2 * | 2/2005 | Deppe et al. | 372/45.01 |
| 6,873,632 B2 * | 3/2005 | Hsieh | 372/38.02 |
| 2003/0206740 A1 * | 11/2003 | Lee et al. | 398/79 |
| 2004/0213574 A1 * | 10/2004 | Han et al. | 398/71 |
| 2005/0018732 A1 * | 1/2005 | Bond et al. | 372/50 |
| 2005/0123298 A1 * | 6/2005 | Kim et al. | 398/70 |
| 2005/0281298 A1 * | 12/2005 | Kupershmidt et al. | 372/34 |

FOREIGN PATENT DOCUMENTS

JP   2002-270949   9/2002

* cited by examiner

METHOD FOR MAINTAINING WAVELENGTH-LOCKING OF FABRY-PEROT LASER REGARDLESS OF CHANGE OF EXTERNAL TEMPERATURE AND WDM LIGHT SOURCE USING THE METHOD

CLAIM OF PRIORITY

This application claims priority to an application entitled "Method for Maintaining Wavelength-locking of Fabry-Perot Laser Regardless of Change of External Temperature and WDM Light Source Using the Method," filed in the Korean Intellectual Property Office on Apr. 21, 2003 and assigned Ser. No. 2003-25147, the contents of which are hereby incorporated by reference.

BACKGROUND OF THE INVENTION

1. Field of the Invention

The present invention relates to an optical communication field using a Fabry-Perot laser, and particularly to a method for maintaining wavelength-locking of a Fabry-Perot laser regardless of a change of external temperature even though a temperature controller is not used, and a WDM light source using the method.

2. Description of the Related Art

In general, wavelength division multiplexing (WDM) passive optical networks (PONs) provide a very-high-speed broadband communication service using a specific wavelength allocated to each subscriber. Therefore, it is possible not only to assure a privacy protection in a communication service, but also to easily expand either a separate communication service required by each subscriber or a communication capacity. Moreover, it is also possible to expand the number of subscribers through an additional specific wavelength, which is scheduled to be allocated to a new subscriber. In spite of these advantages, due to a necessity for an additional wavelength stabilizing circuit for stabilizing both a light source having a particular oscillation wavelength and this oscillation wavelength at a central office (CO) and each subscriber unit, a high economical burden is imposed on each subscriber, so that the WDM PONs has not been commercialized up to date. Thus, to implement the WDM PONs, it is essential to develop an economical WDM light source.

As this economical WDM light source, there have been proposed a distributed feedback (DFB) laser array, a multi-frequency laser (MFL), a spectrum-spliced light source, a wavelength-locked Fabry-Perot laser for wavelength-locking with incoherent light, and so forth.

However, the DFB laser array and the MFL are produced through a complicated process, and are expensive devices in which their own light sources essentially require precise wavelength selectivity and wavelength stabilization to perform WDM.

The spectrum-spliced light source, which has been actively studied recently, performs spectrum-splicing of an optical signal of wide bandwidth using an optical filter or a waveguide grating router (WGR), so that it can provide many wavelength-divided channels. Thus, it does neither need a light source for a particular oscillation wavelength nor equipment for wavelength stabilization. As this spectrum-spliced light source, there have been proposed a light emitting diode (LED), a super-luminescent diode (SLD), a Fabry-Perot (FP) laser, a fiber amplifier light source, an ultra high frequency (UHF) optical pulse light source, and so forth.

However, the LED and the SLD, which have been proposed as the spectrum-spliced light source, are inexpensive and have a wide optical bandwidth, but have a narrow modulation bandwidth and a low power, so that they are more suitable for a light source for an upstream signal having a slow modulation speed rather than for an downstream. The FP laser is an inexpensive high power device, but has a narrow band width, so that it is impossible to provide many wavelength-divided channels. The FP laser has a disadvantage in that its degradation caused by a mode partition noise is serious when it modulates and transmits spectrum-spliced signals at a high speed. The UHF pulse light source has a very wide spectrum band of a light source and a coherency, but has a low stability of oscillated spectrum and a pulse width of several picoseconds at most, so that it is difficult to implement the UHF pulse light source.

Instead of these light sources, a spectrum-sliced fiber amplifier light source has been proposed, which is capable of providing many high power channels wavelength-divided by spectrum division of ASE (Amplified Spontaneous Emission) generated from a fiber amplifier. However, this spectrum-sliced fiber amplifier light source must additionally employ an expensive external modulator such as a Litium Niobate (LiNbO$_3$) modulator so that channels transmit different data from each other.

Meanwhile, the wavelength-locked Fabry-Perot laser performs spectrum-splicing of an optical signal of wide bandwidth using an optical filter or an arrayed waveguide grating (AWG), in which the optical signal is generated from an incoherent light source such as an LED or a fiber amplifier light source. The spectrum-sliced optical signal is injected into a Fabry-Perot laser, and is outputted as a wavelength-locked signal. The wavelength-locked signal is used for transmission at the wavelength-locked Fabry-Perot laser. When a spectrum-spliced signal having higher power than a predetermined level is injected into the Fabry-Perot laser, the Fabry-Perot laser generates and outputs only light having a wavelength harmonized with that of the spectrum-spliced signal. The wavelength-locked Fabry-Perot laser wavelength-locked with this incoherent light perform a direct modulation according to a data signal, so that it can transmit data in a more economical manner.

FIG. 1 is a schematic view for explaining a wavelength-locked phenomenon of a general Fabry-Perot laser. In FIG. 1, of reference numerals, 10 represents an optical spectrum of a general Fabry-Perot laser 40, 20 represents an optical spectrum of external incoherent light inputted into the Fabry-Perot laser 40, 30 represents an optical spectrum of a wavelength-locked Fabry-Perot laser, which is wavelength-locked with the inputted external incoherent light.

Referring to FIG. 1, the Fabry-Perot laser 40 provides a plurality of oscillation modes, which are spaced apart from each other at a uniform wavelength interval centering around one wavelength according to a resonance wavelength of a laser diode and a gain characteristic of a manufacturing material, unlike a distributed feedback (DFB) laser outputting a single wavelength. Thus, when coherent light or incoherent light 20 is inputted from outside, some of the oscillation modes which are mismatched with a wavelength of injection light are suppressed, but the others 30 which are matched with a wavelength of injection light are amplified and outputted.

However, to output a wavelength-locked signal, which is appropriate for high-speed and long-distance transmission, the Fabry-Perot laser must inject a high power optical signal having a wide bandwidth. In addition, when an external temperature is not controlled, its variation causes a mode of the Fabry-Perot laser to be varied. Thus, the Fabry-Perot laser has its wavelength mismatched with a wavelength of the injected spectrum-spliced signal, so that it gets free from a wavelength-locked phenomenon. As a result, the Fabry-Perot laser can be no longer used as a WDM light source. This results from the fact that a wavelength of the Fabry-Perot laser has a rate of change of about 0.1 nm/° C., while a wavelength of the AWG used to perform spectrum-splicing of injection light has a rate of change of about 0.01 nm/° C. Therefore, it is impossible to avoid changing a spectral overlap between the injection light and the oscillation modes of the Fabry-Perot laser according to a change of temperature.

FIG. 2 shows changes of wavelength of external injection light and of output light of a Fabry-Perot laser according to a change of ambient temperature. In FIG. 2a, an ambient temperature is $T_0$. As $T_0$ is sequentially increased by an increment of $\Delta T$ in FIGS. 2b, 2c and 2d in that order, it is shown that an oscillation wavelength of the Fabry-Perot laser undergoes a red shift. Here, it can be seen from FIGS. 2a and 2d that an oscillation mode exists within a line width of 3 dB of the injection light and is wavelength-locked (indicated by a thick arrow). By contrast, it can be seen from FIGS. 2b and 2c that no oscillation mode exists within a line width of 3 dB of the injection light and is wavelength-locked.

Thus, a TEC (Thermo-Electric Cooler) controller in using the wavelength-locked Fabry-Perot laser as a WDM light source.

FIG. 3 shows a structure of the conventional Fabry-Perot laser mounted with a temperature controller.

Referring to FIG. 3, the conventional Fabry-Perot laser comprises a TEC controller 31, a thermistor 32, and a TEC 34. The TEC controller 31 senses a temperature of the Fabry-Perot laser 33 via the thermistor 32 and adjusts the temperature of the Fabry-Perot laser 33 using the TEC 34.

However, in the conventional Fabry-Perot laser, the thermistor and the TEC are coupled to the Fabry-Perot laser, so that a packing cost is increased. Further, the TEC controller is additionally mounted to the Fabry-Perot laser, so that the whole price is increased. Consequently, a WDM PON places a high economical burden on subscribers, so that it has not yet been commercialized.

SUMMARY OF THE INVENTION

Accordingly, the present invention has been made to solve the above-mentioned problems occurring in the prior art, and an object of the present invention is to provide a method for maintaining wavelength-locking of a Fabry-Perot laser regardless of a change of external temperature and wavelength division multiplexing (WDM) light source, as an economical light source used in a WDM optical communication field, using the method, designed so that the wavelength-locking is maintained by external light injection regardless of a change of temperature even though a temperature controller is not used.

In order to accomplish the object, there is provided a wavelength division multiplexing (WDM) light source, comprising: a Fabry-Perot laser for injecting spectrum-spliced incoherent light to amplify and output only an oscillation mode matching with a wavelength of the injected light; and a bias controlling unit for adjusting a bias current supplied to the Fabry-Perot laser to a value adjacent to a threshold current of the Fabry-Perot laser, whose threshold current is changed according to a temperature and a relationship between the injected light changed depending to a temperature and a wavelength of the oscillation mode.

Preferably, it is characterized in that the bias controlling unit comprises: a threshold current sensor for sensing the threshold current of the Fabry-Perot laser; and a bias controller for adjusting the bias current supplied to the Fabry-Perot laser depending on the sensed threshold current, and in that the bias controlling unit controls the bias current supplied to the Fabry-Perot laser to range from half or more to half again or less as much as the threshold current of the Fabry-Perot laser.

In order to accomplish the object, there is provided a method for maintaining wavelength-locking of a Fabry-Perot laser regardless of a change of external temperature, the method comprising the steps of: measuring a threshold current of the Fabry-Perot laser, whose threshold current is changed according to a temperature and a relationship between injected light changed depending to a temperature and a wavelength of oscillation mode; supplying a bias current having a value adjacent to the threshold current to the Fabry-Perot laser; and injecting spectrum-spliced incoherent light into the Fabry-Perot laser.

Preferably, it is characterized in that the bias current supplied to the Fabry-Perot laser ranges from half or more to half again or less as much as the threshold current of the Fabry-Perot laser.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, preferred embodiments of the present invention will be described in detail with reference to the accompanying drawings. For the purposes of clarity and simplicity, a detailed description of known functions and configurations incorporated herein will be omitted as it may make the subject matter of the present invention unclear.

Figure 1:
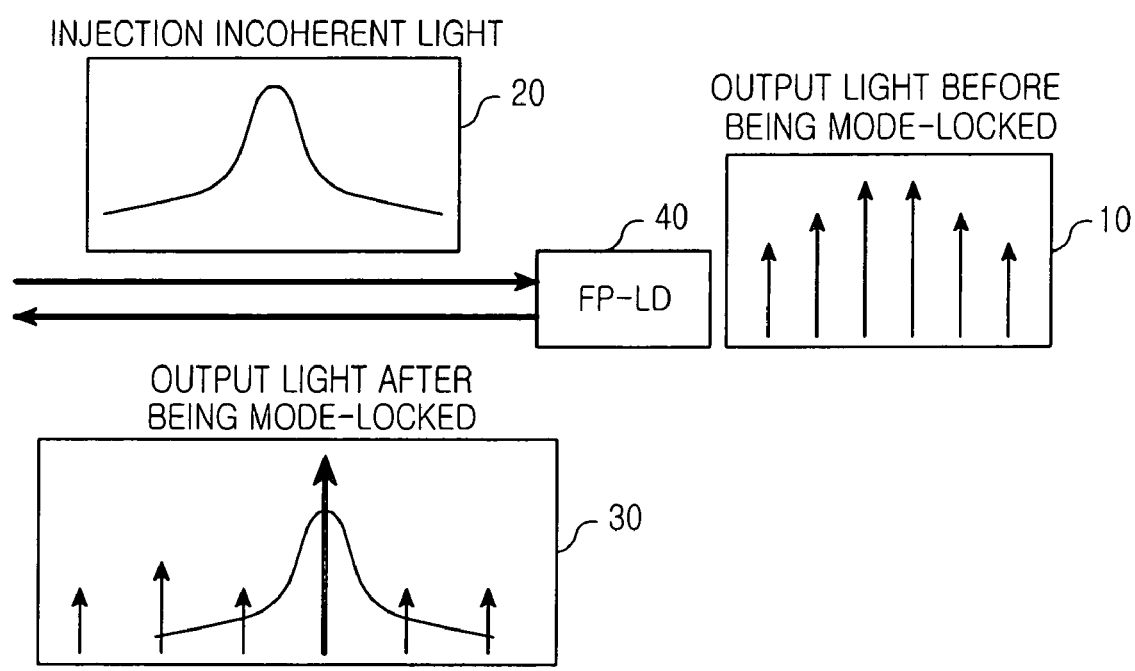
FIG. 1 is a schematic view for explaining a wavelength-locked phenomenon of a general Fabry-Perot laser.
Figure 2:
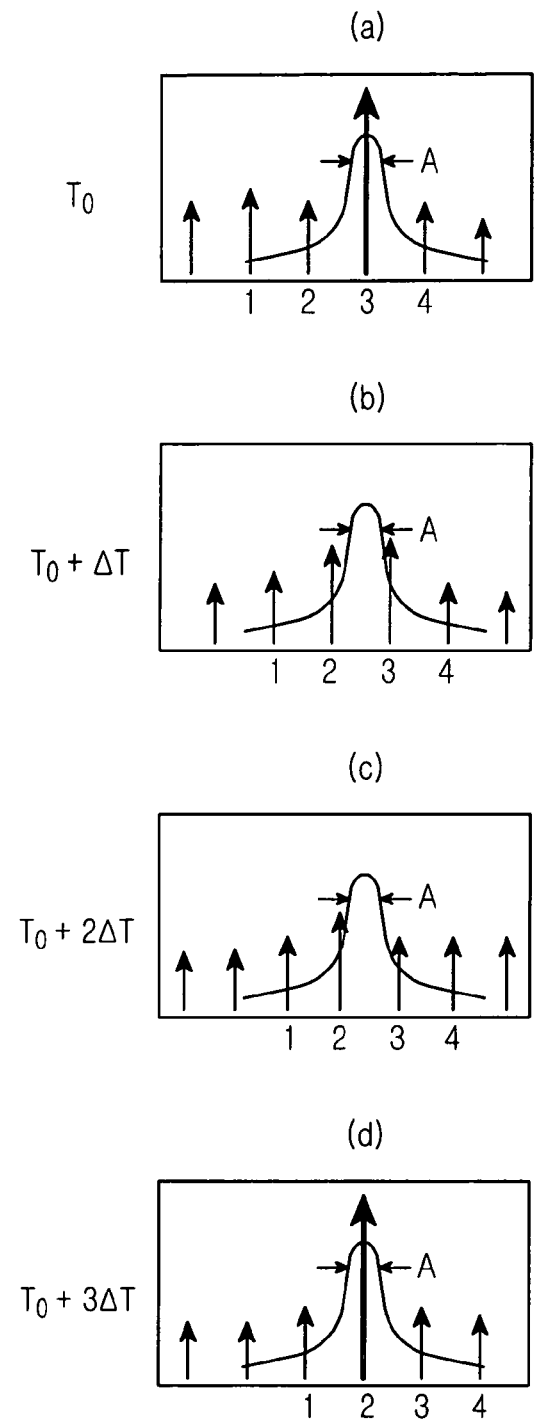
FIG. 2 shows changes of wavelength of external injection light and of output light of a Fabry-Perot laser according to a change of ambient temperature.
Figure 3:
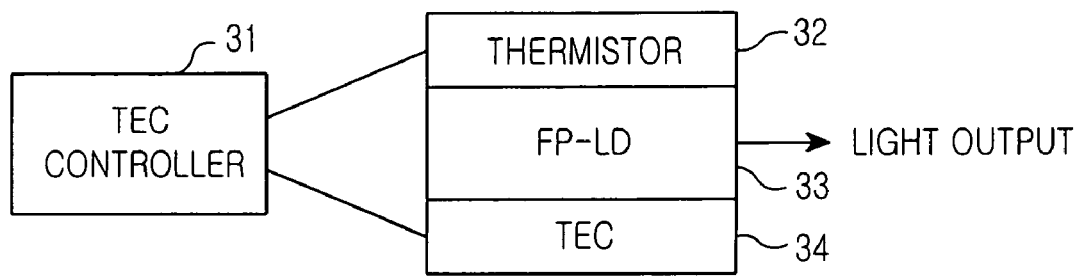
FIG. 3 shows a structure of the conventional Fabry-Perot laser mounted with a temperature controller.
Figure 4:
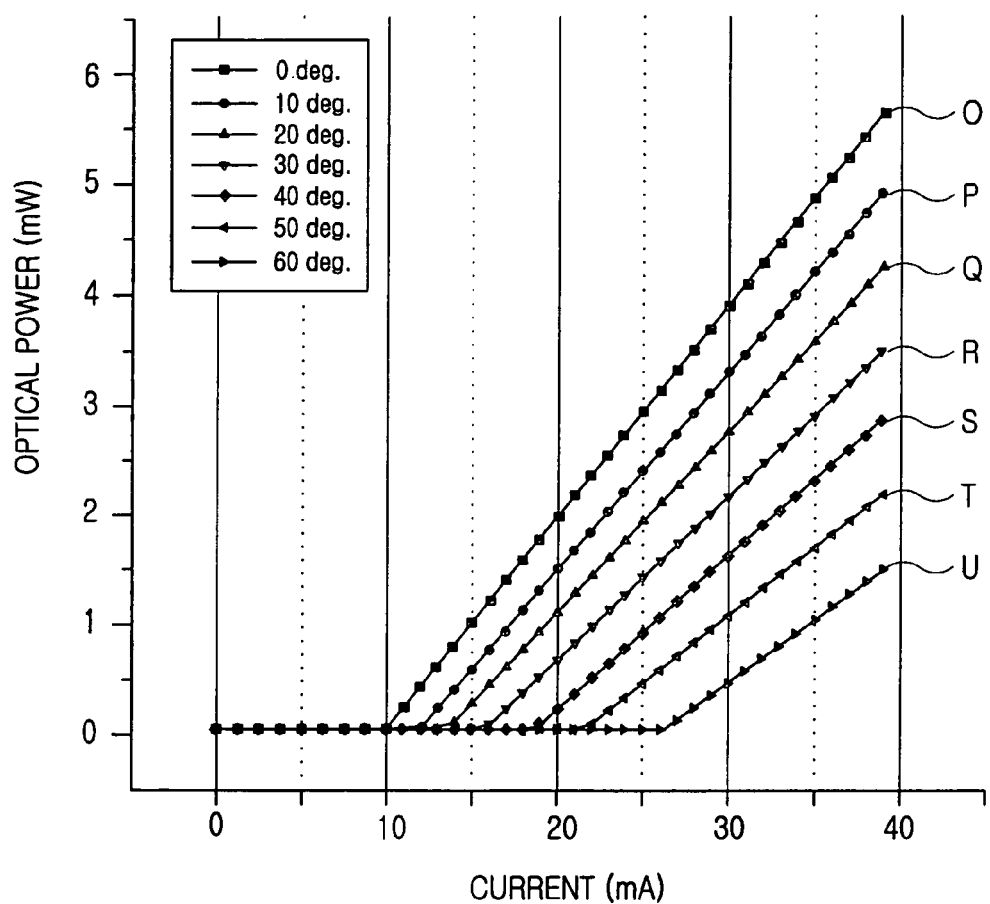
FIG. 4 shows a change of threshold current according to a change of temperature of a general Fabry-Perot laser.

FIG. 4 shows a change of threshold current according to a temperature of a Fabry-Perot laser. With reference to this, a technical principle of the present invention will be described as follows:

Referring to FIG. 4, when a temperature rises from 0° C. to 60° C., a threshold current rises from 10 mA to 27 mA. Due to this sharp change of the threshold current, a wavelength-locked phenomenon of the Fabry-Perot laser is greatly influenced together with a transmission characteristic using the wavelength-locked phenomenon. For example, it is assumed that a bias current of the Fabry-Perot laser is 20 mA. When temperature is low, a threshold current is relatively small compared with the bias current, so that the Fabry-Perot laser has a plurality of strong oscillation modes. Thus, a suppression rate of ambient modes which is restrained by injection of light is reduced, so that the transmission characteristic is deteriorated. However, when temperature is high, a threshold current is relatively great compared with the bias current, so that the Fabry-Perot laser has a weak optical power, and the resultant transmission characteristic is deteriorated. Further, a change of temperature results in varying a spectral overlap between the injection light and the oscillation modes of the Fabry-Perot laser, thus having influence on the wavelength-locked phenomenon and transmission characteristic using the same. In two cases of when a central wavelength of the injection light is well matched with a wavelength of the oscillation modes and of when a central wavelength of the injection light is not well matched with a wavelength of the oscillation modes, a change of the threshold current is incurred due to a characteristic change of a resonator for the Fabry-Perot laser, so that the two cases represent different transmission characteristics from each other. Therefore, when the Fabry-Perot laser is used without a temperature controller, to acquire a good transmission characteristic through wavelength-locking regardless of the change of temperature, it is very important to adjust the bias current provided to the Fabry-Perot laser to a value near the threshold current of the Fabry-Perot laser varying according to a temperature. Here, the value near the threshold current refers to a similar value substantially to the threshold current. A bias current $Ib$ of the Fabry-Perot laser, which can be used without the temperature controller if necessary, is from about half to half again as much as the threshold current $Ith$ of the Fabry-Perot laser ($0.5\ Ith < Ib < 1.5\ Ith$).

Figure 5:
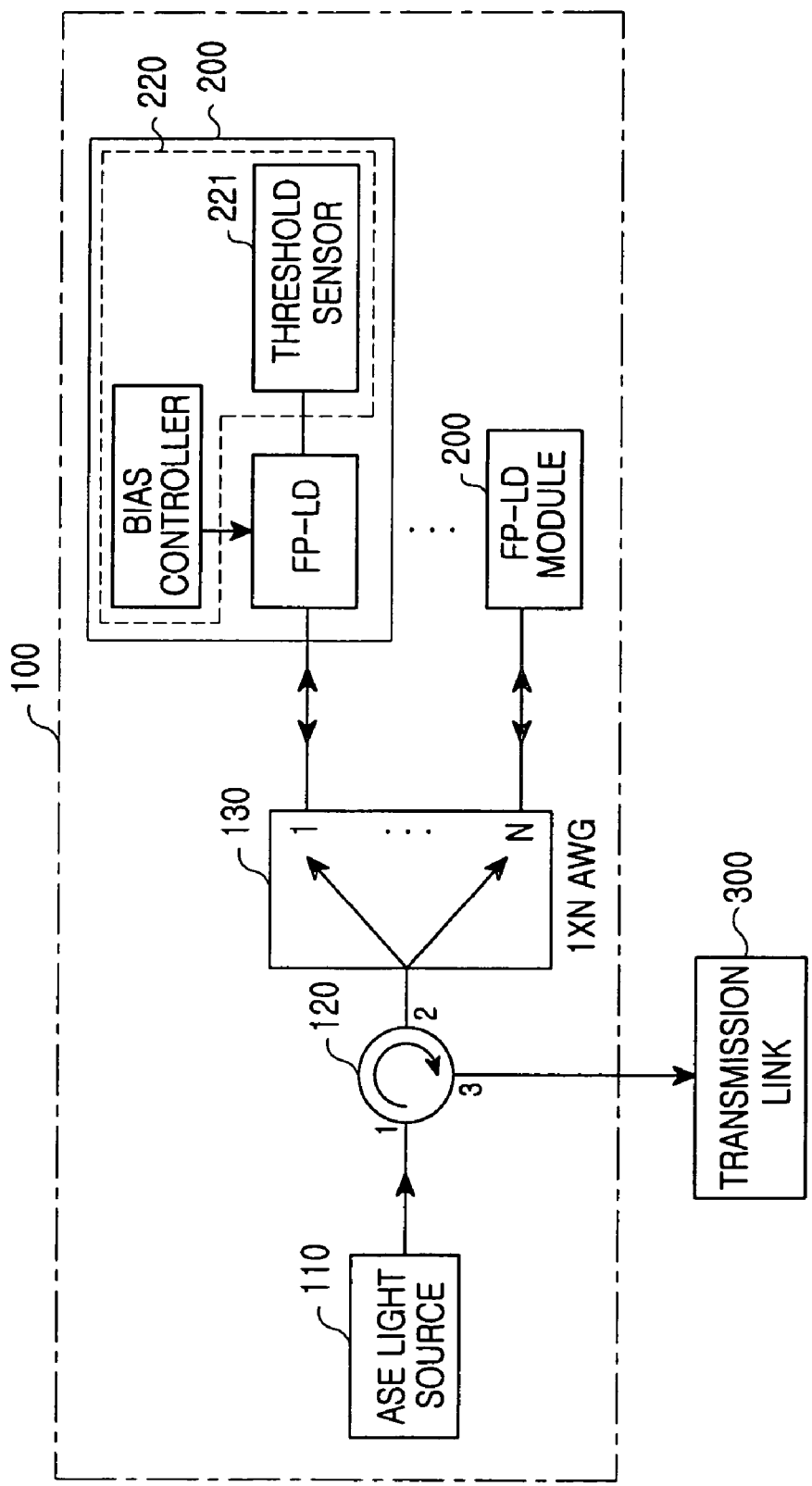
FIG. 5 shows a construction of a WDM light source using a wavelength-locked Fabry-Perot laser according to a preferred embodiment of the present invention.

FIG. 5 shows a construction of a WDM light source using a wavelength-locked Fabry-Perot laser according to a preferred embodiment of the present invention.

A WDM light source 100 of the present invention is wavelength-locked by injection light and outputs a wavelength-division-multiplexed optical signal to a transmission link 300. The WDM light source 100 comprises an ASE source 110, a circulator 120, a 1×N arrayed waveguide grating (AWG) 130, N numeral Fabry-Perot laser modules 200. Each of the Fabry-Perot laser modules 200 includes a Fabry-Perot laser FP-LD or 210 and a bias controlling unit 220.

The ASE source 110, an incoherent light source having a wide line width, generates and outputs light to be injected into the Fabry-Perot laser 210.

The circulator 120 is provided with first to third ports. The circulator 120 outputs incoherent light, which is inputted into the first port after generated from the ASE source 110, to the 1×N AWG 130 through the second port, and outputs a wavelength-division-multiplexed light wavelength-locked with the incoherent light inputted from the 1×N AWG 130 through the second port to the transmission link 300 through the third port.

The 1×N AWG 130 is arranged between the circulator 120 and the Fabry-Perot laser modules 200, and is provided with one multiplexing port and N numeral demultiplexing ports. The AWG 130 branches ASE inputted through the second port into the multiplexing port into incoherent channels having a different central wavelength, and outputs the branched incoherent channels to the N Fabry-Perot laser modules 200. Further, the AWG 130 multiplexes wavelength-locked light inputted from the Fabry-Perot laser modules 200 to output it to the second port of the circulator 120.

The Fabry-Perot laser modules 200 are connected to N demultiplexing ports of the AWG 130 one to one. Each Fabry-Perot laser module 200 includes a Fabry-Perot laser 210 and the bias controlling unit 220. The Fabry-Perot laser 210 outputs light wavelength-locked with incoherent light, which is spectrum-spliced by the AWG 130. The bias controlling unit 220 functions to adjust a bias of the Fabry-Perot laser 210, and includes a threshold sensor 221 and a bias controller 222. The bias of the Fabry-Perot laser 210 is changed according to a temperature and a relationship between the injection light changed depending to a temperature and a wavelength of oscillation modes. The threshold sensor 221 senses an oscillation threshold current of the Fabry-Perot laser 210, which is changed according to a temperature and a relationship between the injection light changed depending to a temperature and a wavelength of oscillation modes. The bias controller 222 adjusts the bias current of the Fabry-Perot laser 210 to a value adjacent to the threshold current. Here, the value adjacent to the threshold current refers to a similar value substantially to the threshold current and can be appropriately adjusted between about half and half again as much as the threshold current $Ith$ of the Fabry-Perot laser ($0.5\ Ith < Ib < 1.5\ Ith$) if necessary.

Figure 6:
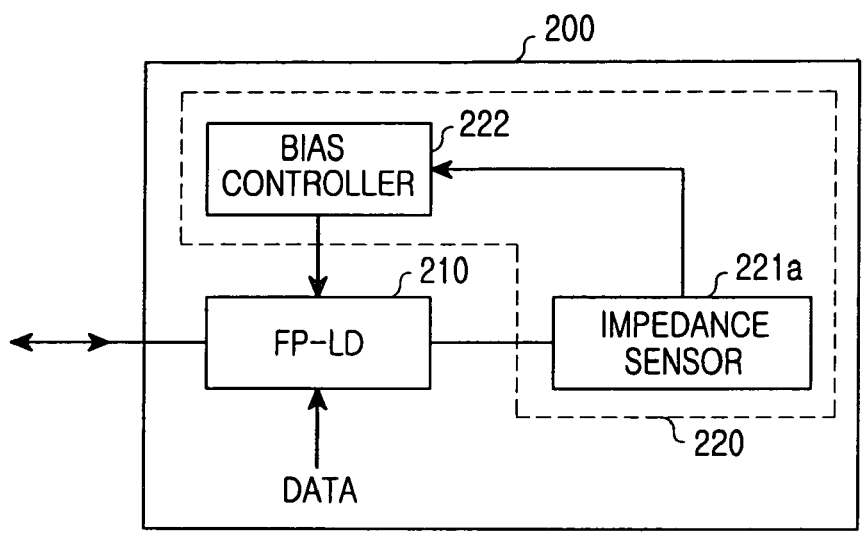
FIG. 6 shows a first construction of a Fabry-Perot laser module employed in FIG. 5.
Figure 7:
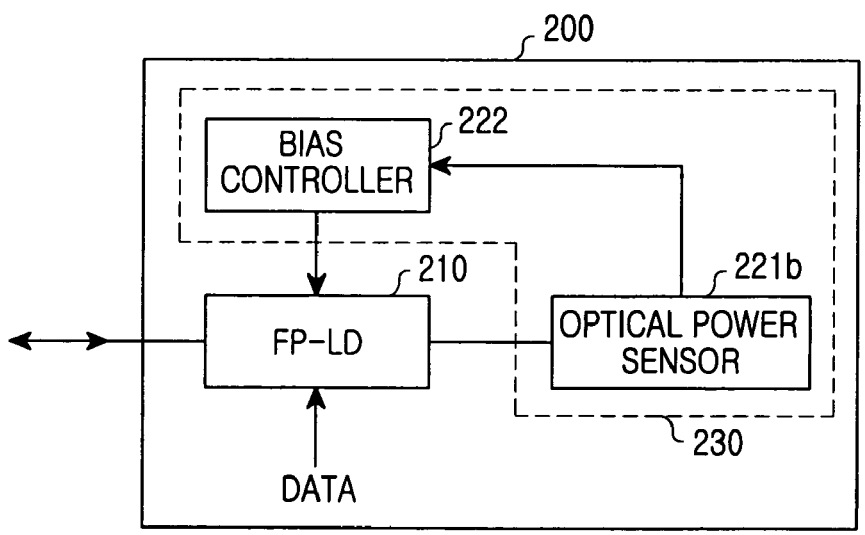
FIG. 7 shows a second construction of a Fabry-Perot laser module employed in FIG. 5.
Figure 8:
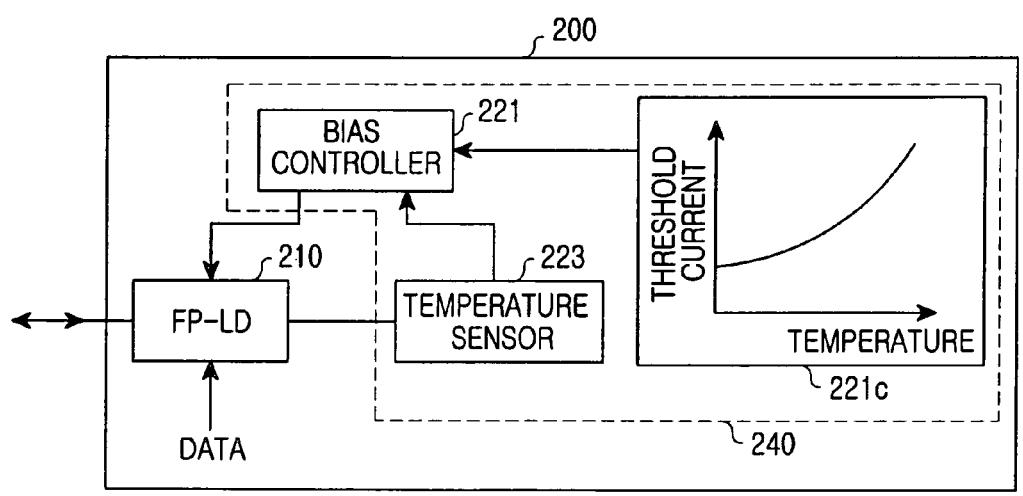
FIG. 8 shows a third construction of a Fabry-Perot laser module employed in FIG. 5.

FIGS. 6 to 8 show different constructions of Fabry-Perot laser modules 200 according to first, second and third embodiment of the present invention, in which the threshold sensor 221 of FIG. 5 is modified.

First, the Fabry-Perot laser module 200 shown in FIG. 6 includes a Fabry-Perot laser 210, an impedance sensor 221$a$ and a bias controller 222, and is designed to sense a threshold current of the Fabry-Perot laser 210 through a change of impedance of the impedance sensor 221$a$. The Fabry-Perot laser module 200 is to make use of the fact that an electrical characteristic (e.g., a resistance value) of the Fabry-Perot laser 210 is greatly changed around its oscillation threshold, and senses the impedance change to control the bias.

The Fabry-Perot laser module 200 of FIG. 7 includes a Fabry-Perot laser 210, an optical power sensor 221$b$ and a bias controller 222, and is designed to sense a threshold current of the Fabry-Perot laser 210 through a change of optical power of the optical power sensor 221$b$. The Fabry-Perot laser module 200 makes use of the fact that an optical power of the Fabry-Perot laser 210 is greatly changed around its oscillation threshold and senses the optical power change to control the bias.

The Fabry-Perot laser module 200 of FIG. 8 includes a Fabry-Perot laser 210, a bias controller 222 and a temperature sensor 223. The Fabry-Perot laser module 200 measures threshold currents according to each temperature of the Fabry-Perot laser 210 in advance to make a lookup table 221$c$ in which the measured threshold currents is converted into data, senses a temperature of the Fabry-Perot laser 210 by means of the temperature sensor 223, searches the lookup table 221$c$ for a value of the threshold current corresponding to the temperature, and controls the bias on the basis of the searched result.

While the invention has been shown and described with reference to certain preferred embodiments thereof, it will be understood by those skilled in the art that various changes in form and details may be made therein without departing from the spirit and scope of the invention as defined by the appended claims.

As mentioned above, according to the present invention, a bias of the Fabry-Perot laser, which is changed according to a temperature and a relationship between injection light changed depending to a temperature and a wavelength of oscillation modes, is appropriately controlled, so that the Fabry-Perot laser can maintain its wavelength-locking regardless of a change of external temperature even though a temperature controller is not used.

Thus, the present invention can realize a WDM light source which requires no temperature controller and a WDM PON using the WDM light source, so that the WDM light source is economical and efficient.

According to the present invention, a wavelength-locked Fabry-Perot laser operating an optimal bias current can maintain an excellent transmission characteristic regardless of a change of temperature even though a temperature controller is not used, so that it can be applied to economically implement a WDM optical transmitter.

What is claimed is:

1. A wavelength division multiplexing (WDM) light source, comprising:
    a Fabry-Perot laser for receiving spectrum-spliced incoherent light to amplify and output only an oscillation mode matching with a wavelength of the injected light;
    a bias controlling unit for limiting a current supplied to the Fabry-Perot laser to a bias current, wherein the bias current has a value adjacent to a threshold current of the Fabry-Perot laser, and wherein the value of the threshold current changes according to temperature of the Fabry-Perot laser and according to relationship between the injected light, which changes depending on the temperature of the Fabry-Perot laser, and a wavelength of the oscillation mode, wherein said bias controlling unit further comprises:
    a threshold current sensor for sensing the threshold current of the Fabry-Perot laser, wherein the threshold current sensor includes an impedance sensor for sensing the threshold current of the Fabry-Perot laser based on a change of impedance of the Fabry-Perot laser; and
    a bias controller for adjusting the bias current supplied to the Fabry-Perot laser depending on the sensed threshold current.

2. A WDM light source according to claim 1, wherein the bias controlling unit controls the bias current supplied to the Fabry-Perot laser to have a value between at least one half and at most one and half of the threshold current of the Fabry-Perot laser.

3. A WDM light source according to claim 1, wherein the threshold current sensor includes an optical power sensor for sensing the threshold current of the Fabry-Perot laser based on a change of optical power of the Fabry-Perot laser.

4. A WDM light source according to claim 1, wherein the threshold current sensor includes both a temperature sensor for sensing a working temperature of the Fabry-Perot laser and a lookup table.

5. A wavelength division multiplexing (WDM) light source comprising:
    a light source;
    a Fabry-Perot laser for suppressing an oscillation mode mismatched with a wavelength of injected light and for amplifying and outputting only an oscillation mode matching with the wavelength of the injected light;
    a wavelength division multiplexer for spectrum-splicing light, which is generated from the light source, to provide the spectrum-spliced light to the Fabry-Perot laser as injecting light, and for multiplexing a wavelength-locked signal wavelength-locked by the Fabry-Perot laser;
    a circulator for inputting the light generated from the light source into the wavelength division multiplexer, and for outputting a multiplexed signal multiplexed by the wavelength division multiplexer to a transmission link;
    a threshold current sensor for sensing a threshold current of the Fabry-Perot laser, whose threshold current is changed according to a temperature, wherein the threshold current sensor includes both a temperature sensor for sensing a working temperature of the Fabry-Perot laser and a lookup table;
    a bias controlling unit for limiting current supplied to the Fabry-Perot laser to a bias current, wherein the bias current has a value adjacent to the threshold current according to the sensed threshold current.

6. A method for maintaining wavelength-locking of a Fabry-Perot laser regardless of a change of external temperature, the method comprising the steps of:
    (a) measuring a threshold current of the Fabry-Perot laser, whose threshold current is changed according to a temperature and a relationship between injected light changed depending to a temperature and a wavelength of oscillation mode;
    (b) limiting a current supplied to the Fabry-Perot laser to a bias current, the bias current having a value adjacent to the threshold current of the Fabry-Perot laser;
    (c) injecting spectrum-spliced incoherent light into the Fabry-Perot laser;
    (d) providing a threshold current sensor for sensing the threshold current of the Fabry-Perot laser, wherein the threshold current sensor includes an impedance sensor for sensing the threshold current of the Fabry-Perot laser based on a change of impedance of the Fabry-Perot laser; and
    (e) providing a bias controller for adjusting the bias current supplied to the Fabry-Perot laser depending on the sensed threshold current.

7. A method according to claim 6, wherein the bias current supplied to the Fabry-Perot laser has a value between at least one half and at most one and half of the threshold current of the Fabry-Perot laser.

8. A method according to claim 6, wherein step a is carried out by measuring a change of optical power of the Fabry-Perot laser.

9. A method according to claim 6, wherein step a is carried out by measuring a change of impedance of the Fabry-Perot laser.

10. A method for maintaining wavelength-locking of a Fabry-Perot laser regardless of a change of external temperature, the method comprising the steps of:
    (a) measuring a threshold current of the Fabry-Perot laser, whose threshold current is changed according to various temperatures and according to a relationship between injected light changed depending to a temperature and a wavelength of oscillation mode;
    (b) converting the temperature and the threshold current corresponding to the temperature into data and for storing the data;
    (c) measuring a working temperature of the Fabry-Perot laser;
    (d) limiting a current supplied to the Fabry-Perot laser to a bias current that is generated using the stored data, the bias current having a value adjacent to a threshold current corresponding to the working temperature of the Fabry-Perot laser;

(e) injecting spectrum-spliced incoherent light into the Fabry-Perot laser;

(d) providing a threshold current sensor for sensing the threshold current of the Fabry-Perot laser, wherein the threshold current sensor includes an impedance sensor for sensing the threshold current of the Fabry-Perot laser based on a change of impedance of the Fabry-Perot laser; and (e) providing a bias controller for adjusting the bias current supplied to the Fabry-Perot laser depending on the sensed threshold current.

11. A method according to claim 10, wherein the bias current supplied to the Fabry-Perot laser has a value between at least one half and at most one and half of the threshold current of the Fabry-Perot laser.

* * * * *